United States Patent
Okuni

(10) Patent No.: US 6,844,264 B2
(45) Date of Patent: Jan. 18, 2005

(54) DRY ETCHING METHOD

(75) Inventor: Mitsuhiro Okuni, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/006,718

(22) Filed: Dec. 10, 2001

(65) Prior Publication Data

US 2002/0119667 A1 Aug. 29, 2002

(30) Foreign Application Priority Data

Dec. 26, 2000 (JP) .................................. 2000-394317

(51) Int. Cl.$^7$ .................................................. H01L 21/302
(52) U.S. Cl. ....................... 438/706; 438/710; 438/714; 716/58
(58) Field of Search ................... 438/706, 710, 438/712, 714, 720, 713; 216/58, 67; 156/345

(56) References Cited

U.S. PATENT DOCUMENTS

| 4,708,766 | A | * | 11/1987 | Hynecek ........................ 156/345 |
| 5,368,685 | A | * | 11/1994 | Kumihashi et al. ........... 156/345 |
| 5,801,101 | A | * | 9/1998 | Miyoshi ......................... 438/714 |
| 6,220,201 | B1 | * | 4/2001 | Nowak et al. ................. 118/723 |

\* cited by examiner

*Primary Examiner*—Lan Vinh
(74) *Attorney, Agent, or Firm*—McDermott Will & Emery LLP

(57) ABSTRACT

When the Cu-containing aluminum film is dry-etched with etching gas containing chlorine gas, the gas stay time τ of the etching gas staying in the chamber, which is expressed by P·V/Q, where P being the chamber pressure (unit: Pa), V the chamber volume (unit: L) and Q the total flow of etching gas (unit: Pa·L/sec), is from 0.15 seconds to 0.30 seconds inclusive.

10 Claims, 9 Drawing Sheets

DRY ETCHING METHOD

BACKGROUND OF THE INVENTION

The present invention relates to a dry-etching method whereby interconnect patterning is made through the dry-etching of a Cu-containing aluminum film formed on a substrate, and more particularly, to a Cu-containing aluminum film dry-etching method that prevents the generation of copper residues during etching.

As the design rule of semiconductor devices becomes increasingly finer these years, MOS field-effect transistors have occupied the major portion of the elements constituting semiconductor devices. Also as the design rule of MOS field-effect transistors becomes finer, the multi-layered interconnect structure itself becomes increasingly finer as well. For example, the damascene method has come to be employed in the copper interconnect formation process for the fabrication of semiconductor devices to which design rules of 0.13 µm or narrower are applied. On the other hand, the dry etching method has been employed in the interconnect formation process for semiconductor devices to which the 0.15 µm design rule is applied because of its process simplicity. In this case, the major interconnect material is aluminum. Downsizing of the multi-layered interconnect structure, however, is approaching its limits; indeed, the minimum pitches between neighboring lines are currently set at 0.40 µm or shorter.

As one of the excellent techniques for the formation of high-quality aluminum interconnects, a fine pattern interconnect forming method is generally known that uses the plasma dry-etching system for patterning a Cu-containing aluminum film. This dry-etching technique has been used in a wide range of semiconductor applications. This dry-etching method employs mixtures of chlorine gas, boron trichloride gas and nitrogen gas in most cases.

Then a conventional dry-etching method, specifically, an interconnect pattern formation method employing the dry-etching of the Cu-containing aluminum film will be described below with reference to attached drawings.

FIGS. 7A–7B are sectional views illustrating the steps of the conventional dry-etching method.

Referring now to FIG. 7A, a first barrier metal film 3 of a thickness of 20 nm, a Cu-containing aluminum film 4 of a thickness of 300 nm and a second barrier metal film 5 of a thickness of 20 nm are formed one after another on a silicon substrate 1 with a dielectric film 2(silicon oxide film) interposed between the substrate 1 and the film 3. The first barrier metal film 3 and the second barrier metal film 5 have the respective multi-layered structures composed of TiN and Ti layers. The mass ratio between aluminum and copper in the Cu-containing aluminum film 4 is 99.5%:0.5%. Hereafter, the multi-layer structure composed of the first barrier metal film 3, Cu-containing aluminum film 4 and the second barrier metal film 5 is referred to as a TiN/Ti/AlCu/TiN/Ti film 6. Each layer in the TiN/Ti/AlCu/TiN/Ti film 6 is deposited sequentially by sputtering, for example.

Next a resist film is formed on the TiN/Ti/AlCu/TiN/Ti film 6, and this resist film is exposed and developed for patterning. Then, as shown in FIG. 7A, a resist pattern 7 is formed that covers the interconnect region.

Subsequently, the TiN/Ti/AlCu/TiN/Ti film 6 is dry-etched, with the resist pattern 7 being used as a mask, by the use of an etching gas of which major content is chlorine gas, in order to for an interconnect 6A consisting of the TiN/Ti/AlCu/TiN/Ti film 6, as shown in FIG. 7B.

As the chamber pressure in the dry etching apparatus is reduced, the ratio of gas radicals (radicals generated from the plasma-activated etching gas) falling vertically on the silicon substrate 1 increases in general. As a result, it becomes easy to for an interconnect 6A of a cross-section having clear-cut vertical straight sides, and then the preferable interconnect shape can be provided. Namely, the interconnect pattern can be formed with high accuracy in shape. On the other hand, if the chamber pressure is reduced, copper residues 8 are likely to appear around the interconnect 6A, in particular, between interconnects, as shown in FIG. 7B. If the copper residue 8 is created, it causes leak current between interconnects, for example, and eventually leads to lower manufacturing yields in the semiconductor device manufacturing process.

To prevent the generation of copper residue during the dry-etching of the Cu-containing aluminum film, an aluminum ring (hereafter, Al ring) is occasionally mounted on the rim of the lower electrode on which the substrate is mounted for treatment in the plasma dry-etching apparatus.

FIG. 8A illustrates a schematic view of a structure of a conventional plasma dry etching apparatus, specifically, inductively coupled plasma (ICP) apparatus, while FIG. 8B is a top view of the lower electrode of the apparatus shown in FIG. 8A on which the substrate is mounted.

As shown in FIGS. 8A and 8B, the lower electrode 12 on which a wafer 11, the substrate to be treated is mounted is installed on a holder 13, at the bottom of the chamber 10 where plasma is generated. The inner wall of the chamber 10 is coated with anodized aluminum. The lower electrode 12 is connected to the bias power source 14 located outside the chamber 10. An Al ring 15 is mounted on the rim of the lower electrode 12 so as to surround the wafer 11. An inductive coupler coil 16 is installed on the top of the chamber 10, while this inductive coupler coil 16 is connected to a high frequency power source 17 located outside the chamber 10.

By employing such an Al ring in the plasma etching apparatus, namely, employing such a dry etching apparatus shown in FIGS. 8A and 8B, it becomes possible to prevent the generation of copper residue during the dry etching process for the Cu-containing aluminum film. The use of an Al ring, however, may cause a difference in the etching rates of the Cu-containing aluminum film between the wafer peripheral and the wafer center. Further, as the properties of the Al ring change with time, the etching rate as well comes to change with time. As a result, the dry etching process becomes difficult to control, and eventually the manufacturing yield of the semiconductor device manufacturing process falls.

In addition to the Al ring, there are other conventional dry-etching methods for etching the Cu-containing aluminum film preventing the generation of copper residue. For example, the temperature of the lower electrode of the plasma dry etching apparatus is raised; and an excessive over-etching is employed.

First, the former method for raising the temperature of the lower electrode will be explained for the case where this method is applied to the conventional dry etching process shown in FIGS. 7A and 7B. A case of using the ICP etching apparatus is exemplified that is operated under the etching conditions described in Table 1.

TABLE 1

| | |
|---|---|
| $BCl_3/Cl_2/N_2$ | 90/90/100 (mL/min) |
| Pressure | 0.4 (Pa) |
| ICP/RF | 300/200 (W) |
| Temperature of lower electrode | 80 (° C.) |
| Over etching rate | 30% |

As described in Table 1, the etching gas is a mixture of boron trichloride ($BCl_3$), chlorine gas ($Cl_2$) and nitrogen gas($N2$). The gas flow rates for $BCl_3$, $Cl_2$ and $N_2$ are 90 mL/min, 90 mL/min and 100 mL/min, respectively, all under the standard state. The chamber pressure is 0.4 Pa; the high frequency power (ICP) applied to the inductive coupler coil is 300W; and the high frequency power (RF) applied to the lower electrode is 200W. The temperature of the lower electrode is set at 80° C., higher than the usual temperature, 50° C. The over etching rate is set at 30%.

In the present specification, the over etching rate is the ratio to the main etching of the over etching that is performed after the main etching so as to ensure the etching of the film. The main etching is defined by (film thickness before etching)/(etching rate).

If the TiN/Ti/AlCu/TiN/Ti film 6 is dry-etched with the resist pattern 7 used as a mask under the etching conditions shown in Table 1 (see FIGS. 7A and 7B), the temperature of the TiN/Ti/AlCu/TiN/Ti film 6 as well tends to become high since the temperature of the lower electrode is high. As a result, the copper residue 8 is not likely to be produced because the TiN/Ti/AlCu/TiN/Ti film 6 (particularly Cu-containing aluminum film 4) reacts well with gas radicals. However, as shown in FIG. 9, the interconnect 6A tends to present an inversely tapered shape rather than a cross-section having clear-cut vertical straight sides because of the side etching effect.

Next explained is the excessive over-etching method, which is applied to the conventional dry-etching process shown in FIGS. 7A and 7B under the etching conditions shown in Table 2 for the ICP etching apparatus.

TABLE 2

| | |
|---|---|
| $BCl_3/Cl_2/N_2$ | 90/90/100 (mL/min) |
| Pressure | 0.4 (Pa) |
| ICP/RF | 300/200 (W) |
| Temperature of lower electrode | 50 (° C.) |
| Over etching rate | 70% |

The differences from Table 1 with regard to etching conditions are that the temperature of the lower electrode is 50° C. in Table 2, lower than that in Table 1, and that the over-etching rate is 70% in Table 2, higher than that in Table 1.

If the TiN/Ti/AlCu/TiN/Ti film 6 is dry-etched, with the resist pattern 7 being used as a mask, under the etching conditions shown in Table 2 (see FIGS. 7A and 7B), the copper residue 8 is removed by the over-etching, as a result of the lift-off of the dielectric film 2 serving as the base layer of the TiN/Ti/AlCu/TiN/Ti film 6. Meanwhile, the resist pattern 7 serving as an etching mask is likely to be lost during over-etching and thus the shape of the top of the interconnect 6A tends to collapse, referring to FIG. 10. Namely, it becomes difficult to for an interconnect 6A of the precise target shape.

As described so far, if one tries to for interconnect of a precise shape by reducing the chamber pressure and patterning the Cu-containing aluminum film based on the conventional dry-etching method, copper residue is likely to be formed and thus leak current may run between interconnects.

Meanwhile, if one tries to for interconnect by raising the temperature of the lower electrode or conducting the excessive over-etching based on the conventional dry etching method, in order to pattern the Cu-containing aluminum film and prevent the generation of copper residue, the cross-section of the interconnect tends to present an inversely tapered shape or the shape of the top of the interconnect is likely to collapse. Such degradation in the shape of interconnect leads to an interconnect resistance larger than expected levels and then results in significantly lowered performance in the manufactured multi-layer interconnect.

In other words, the precise shaping of interconnect and the prevention of copper residue are in the relation of trade-off, and they are not attained at the same time by the conventional dry etching method. As a result, problems are often posed in the multi-layered interconnect structure.

SUMMARY OF THE INVENTION

It is, therefore, an object of the present invention to provide a dry etching method for preventing the degradation of the interconnect shape and the generation of copper residue when forming interconnect patterns by dry-etching the Cu-containing aluminum film.

To attain the above-mentioned object, the inventor has performed the following investigation.

First, referring to FIG. 1, the mechanism by which the etching gas containing chlorine gas dry-etches copper in the Cu-containing aluminum film.

As shown in FIG. 1, the dry etching is conducted on the Cu-containing aluminum film 52 formed on the substrate 50 via a dielectric film 51, with the resist pattern 53 being used as a mask and the mixture gas containing chlorine gas being used as the etching gas. In this process, aluminum chloride 54 ($AlClx$: $1 \leq x \leq 4$), which is a reaction product of chlorine gas and aluminum contained in the Cu-containing aluminum film 52, reacts with copper in the Cu-containing aluminum film 52 to provide copper aluminum chloride 55 ($AlCuCly$: $1 \leq y \leq 3$). Namely, copper in the Cu-containing aluminum film 52 is etched by vaporization, being incorporated into copper aluminum chloride 55 ($AlCuCly$: $1 \leq y \leq 3$).

Considering the mechanism illustrated shown in FIG. 1, the inventor has thought that if the reaction product, i.e. aluminum chloride, is allowed to stay longer in the chamber of the dry etching apparatus, the amount of aluminum chloride grows, accordingly the dry-etching of copper is enhanced, and eventually the generation of copper residue is prevented. In other words, the inventor has assumed that the generation of copper residue can be prevented by prolonging the stay time of the etching gas in the chamber (hereafter, gas stay time). The gas stay time is defined by the following equation:

$$\text{Gas stay time } \tau \text{ (unit: second)} = P \cdot V/Q,$$

where P is pressure(unit: Pa) in the chamber, V the volume (unit: L) of the chamber and Q the total flow(unit: Pa·L/sec) of the etching gas.

This indicates that the gas stay time becomes longer when the chamber pressure is raised or the total flow of etching gas is reduced. Note that 1 Pa·L/sec (at the standard state)=about 0.59 mL/min (at the standard state).

In the next step, the inventor has investigated relations between the gas stay time and the quantity of copper residues under various etching conditions, in order to prove the above assumption.

FIG. 2A is a schematic diagram of the plasma dry etching apparatus, more specifically, an ICP etching apparatus used by the inventor so as to investigate the relationship between the gas stay time and the quantity of copper residues; and FIG. 2B is a view of the lower electrode seen from its top where the substrate that will be etched is mounted in the etching apparatus of FIG. 2A.

Referring now to FIGS. 2A and 2B, the lower electrode 62 on which the wafer 61 that will be etched is mounted is installed on a holder 63, at the bottom of the chamber 60 where plasma is generated. The inner wall of the chamber 60 is coated with anodized aluminum. The lower electrode 62 is connected to the bias power source 64 located outside the chamber 60. An inductive coupler coil 65 is installed on the top of the chamber 60, while this inductive coupler coil 65 is connected to a high frequency power source 66 located outside the chamber 60.

Table 3 describes a few examples of etching conditions including the gas stay time for the main etching in the ICP etching apparatus shown in FIGS. 2A and 2B. Specifically, the etching conditions include, in addition to the gas stay time, the total etching gas flow and the pressure in the chamber 60. The volume of the chamber 60 is about 32.5 L, while the etching gas is a mixture of $BCl_3$, $Cl_2$ and $N_2$. The Cu-containing aluminum film that is formed on the wafer 61 for etching is 300 nm thick, while the mass ratio between aluminum and copper in the Cu-containing aluminum film is 99.5%:0.5%. The high frequency power applied to the inductive coupler coil 65 by the high frequency power source 66 is 300W; the high frequency power applied to the lower electrode 62 by the bias power source 64 is 200W; the temperature of the lower electrode 62 is 50° C., and the over-etching rate is 30%.

TABLE 3

| $BCl_3/Cl_2/N_2$ (mL/min) | Pressure (Pa) | Gas stay time (sec) |
| --- | --- | --- |
| 40/50/30 | 0.67 | 0.107 |
| 40/50/30 | 0.93 | 0.150 |
| 60/75/45 | 0.93 | 0.225 |
| 40/50/30 | 1.33 | 0.214 |
| 20/25/15 | 0.93 | 0.300 |
| 40/50/30 | 1.60 | 0.257 |
| 80/100/60 | 1.86 | 0.150 |
| 40/50/30 | 1.86 | 0.300 |
| 20/25/15 | 1.86 | 0.600 |
| 40/50/30 | 2.12 | 0.343 |

Referring now to FIG. 3, the gas stay time varies with the total etching gas flow, namely, the total gas flow of $BCl_3$, $Cl_2$ and $N_2$ and the pressure in the chamber 60, respectively.

FIG. 3 illustrates how the quantity of copper residues depends on the gas stay time when the Cu-containing aluminum film is dry-etched with the ICP etching apparatus shown in FIGS. 2A and 2B under the etching conditions listed in Table 3. The horizontal axis of FIG. 3 indicates the gas stay time (unit: seconds) for the mixture gas of $BCl_3$, $Cl_2$ and $N_2$ during the process of the main etching, while the vertical axis of FIG. 3 indicates the count of copper residues (concretely, copper particles at least 200 nm in diameter) detected by a common particle detecting apparatus.

Referring now to FIG. 3, the quantity of copper residues is on the order of several thousands when the gas stay time is around 0.1 seconds or less, and then leak current easily takes place between interconnects. On the other hand, when the gas stay time is at least 0.15 seconds, the quantity of copper residues is 100 or less, and therefore the occurrence of leak current can be well prevented. As the gas stay time is prolonged, the count of copper residues decreases; however, if the gas stay time is 0.3 seconds or longer, the Cu-containing aluminum film is over-etched.

In this way the inventor has found that the preferred gas stay time during the dry-etching of the Cu-containing aluminum film lies between 0.15 and 0.30 seconds.

On the other hand, when interconnects are formed by dry-etching the Cu-containing aluminum film, the shape of interconnects is also important. Namely, it is crucial to for interconnects of a cross-section having clear-cut vertical straight sides.

The inventor, therefore, has investigated how the interconnect shape, namely, the shape of the Cu-containing aluminum film patterned by dry-etching, and the selectivity of the Cu-containing aluminum film against the resist pattern serving as the etching mask (hereafter, against-resist selectivity) respectively depend on the chamber pressure, using the ICP etching apparatus shown in FIGS. 2A and 2B. The investigation results are shown in FIG. 4. The horizontal axis of FIG. 4 indicates the pressure (unit: Pa) in the chamber 60 during the main etching. The right vertical axis of FIG. 4 indicates the against-resist selectivity (specifically, the ratio of the etching rate of the Cu-containing aluminum film to that of the resist pattern), while the left vertical axis of FIG. 4 indicates the shape angle (unit: degrees) of the aluminum film defined in FIG. 5. Namely, the shape angle of the aluminum film represents how much the cross-section of the Cu-containing aluminum film forming interconnect is inversely tapered. The symbols, square and circle in FIG. 4, correspond to the against-resist selectivities and the shape angles of the aluminum film that were measured by varying the chamber pressure from 0.67 Pa (5 mTorr) with intervals of 0.26 Pa (2 mTorr). In FIG. 4, the curves approximating the measured values of the against-resist selectivity and of the shape angle of the aluminum film are drawn as well.

Referring now to FIG. 4, when the pressure in the chamber 60 is as low as 0.67 Pa, the against-resist selectivity becomes as low as around 1. As a result, the shape of the top of interconnect collapses (see the shape of interconnect 6A shown in FIG. 10), because both the resist pattern serving as a mask and the Cu-containing aluminum film are etched at the same etching speed. Provided that the against-resist selectivity must be at least about 2 in order to prevent the collapse of the shape of the top of interconnect, the pressure in the chamber 60 must be 0.93 Pa or higher.

Further, as shown in FIG. 4, if the pressure in the chamber 60 is too large, the side walls of the Cu-containing aluminum film are etched and consequently the shape angle of the aluminum film becomes smaller than 90 degrees. To be more specific, if the pressure in the chamber 60 is as high as 2.0 Pa (15 mTorr), the side walls of the Cu-containing aluminum film are etched and then the shape angle of the aluminum film becomes around 85 degrees (see the shape of interconnect 6A in FIG. 9), because the ratio of gas radicals and ions that are introduced in the vertical direction onto the Cu-containing aluminum film that will be etched decreases. Provided that the shape angle of the aluminum film must be 87.5 degrees or larger to provide the best interconnect resistance, the pressure in the chamber 60 must be 1.86 Pa (14 mTorr) or lower.

Summarizing the results shown in FIG. 3 and FIG. 4, in other word, considering the overall relationship between the gas stay time and the quantity of copper residues and how the chamber pressure influences the shape angle of the aluminum film and against-resist selectivity, the following conclusions are obtained. Namely, there are such problems raised: if the chamber pressure is low, the against-resist selectivity decreases and the quantity of copper residues increases; while if the chamber pressure is high, the quantity of copper residues decreases but the side walls of the Cu-containing aluminum film are deeply etched.

Then the inventor has found that the chamber pressure should be in the 0.93 to 1.86 Pa range during the dry-etching of the Cu-containing aluminum film, in order to provide the preferable interconnect shape and prevent the generation of copper residues at the same time. Nevertheless, the chamber pressure is not limited to the above range if one hopes to obtain a preferable interconnect shape, placing less importance on the quantity of copper residues.

If the preferable ranges for the gas stay time and the chamber pressure are determined, the preferable range of the total etching gas flow is also determined accordingly by the definition of the gas stay time (gas stay time=chamber pressure×chamber volume/total etching gas flow). To be more specific, if the Cu-containing aluminum film on the wafer substrate of a diameter of 20 cm (8 inches) is dry-etched inside the chamber of a common ICP dry etching apparatus (its volume is from about 30 L to 35 L inclusive), the total etching gas flow should be in the 60 mL/min (at the standard state)–240 mL/min (at the standard state) range.

Meanwhile, if the Cu-containing aluminum film on the wafer substrate of a diameter of 30 cm (12 inches), which is the possible wafer size for the near future, is dry-etched inside the chamber of an ICP dry etching apparatus (its volume is from about 60 L to 70 L inclusive), the total etching gas flow should be in the 120 mL/min (at the standard state)–480 mL/min (at the standard state) range. Nevertheless, the total etching gas flow is not limited to the above range if one hopes to obtain a preferable interconnect shape, placing less importance on the quantity of copper residues.

The present invention has been made on the basis of the above investigation. More particularly, a first dry-etching method according to the present invention is based on a dry-etching method for dry-etching a Cu-containing aluminum film on a substrate to be etched and held in a chamber where plasma of an etching gas containing at least chlorine gas is generated. With the chamber pressure being P (unit: Pa), the chamber volume being V (unit: L) and the total etching gas flow being Q (unit: Pa·L/sec), then the gas stay time, $\tau=P\cdot V/Q$, is from 0.15 seconds to 0.30 seconds inclusive.

According to the first dry-etching method of the invention, the etching gas stay time in the chamber is at least 0.15 seconds, when the Cu-containing aluminum film is dry-etched with an etching gas containing chlorine gas. Then it becomes possible to prevent the generation of copper residue during etching because aluminum chloride which is a reaction product facilitating the copper etching is sufficiently provided. Further, since the gas stay time is 0.30 seconds or lower, there is no fear that the Cu-containing aluminum film is over-etched, and thus the shape of interconnect resulting from the patterning of the Cu-containing aluminum film does not degrade. Since the leak current between interconnects is prevented and the interconnect resistance does not grow than desired levels, semiconductor devices of high performance can be manufactured at high yields.

In the first dry-etching method, the substrate to be etched may be a wafer of a diameter of 20 cm, and the chamber volume may be from 30 L to 35 L inclusive. In such a case, the total etching gas flow is preferably from 60 mL/min (at the standard state) to 240 mL/min (at the standard state) inclusive.

In the first dry-etching method, the substrate to be etched may be a wafer of a diameter of 30 cm, and the chamber volume may be from 60 L to 70 L inclusive. In such a case, the total etching gas flow is preferably from 120 mL/min (at the standard state) to 480 mL/min (at the standard state) inclusive.

A second dry-etching method according to the present invention is based on a dry-etching method for dry-etching a Cu-containing aluminum film on a substrate to be etched and held in a chamber where plasma of an etching gas containing at least chlorine gas is generated. With the chamber pressure being P (unit: Pa), the chamber volume being V (unit: L) and the total etching gas flow being Q (unit: Pa·L/sec), then the gas stay time, $\tau=P\cdot V/Q$ ($0.93 \leq P \leq 1.86$), is from 0.15 seconds to 0.30 seconds inclusive.

According to the second dry-etching method, the etching gas stay time in the chamber is at least 0.15 seconds, when the Cu-containing aluminum film is dry-etched with an etching gas containing chlorine gas. Then it becomes possible to prevent the generation of copper residue because aluminum chloride which is a reaction product facilitating the copper etching is sufficiently provided. Further, since the gas stay time is 0.30 seconds or lower, there is no fear that the Cu-containing aluminum film is over-etched, and thus the shape of interconnect resulting from the patterning of the Cu-containing aluminum film does not degrade. Since the leak current between interconnects is prevented and the interconnect resistance does not grow than desired levels, semiconductor devices of high performance can be manufactured at high yields.

According to the second dry-etching method, since the chamber pressure is from 0.93 Pa to 1.86 Pa inclusive, the selectivity of the Cu-containing aluminum film to the resist pattern serving as a mask does not decrease, and the etching of the side walls of the Cu-containing aluminum film can be prevented. The generation of copper residue is thereby prevented, and the interconnect of a preferable shape can be formed with high reliability.

In the second dry-etching method, the substrate may be a wafer of a diameter of 20 cm, and the chamber volume may be from 30 L to 35 L inclusive. In such a case, the total etching gas flow is preferably from 60 mL/min (at the standard state) to 240 mL/min (at the standard state) inclusive.

In the second dry-etching method, the substrate may be a wafer of a diameter of 30 cm, and the chamber volume may be from 60 L to 70 L inclusive. In such a case, the total etching gas flow is preferably from 120 mL/min (at the standard state) to 480 mL/min(at the standard state) inclusive.

DETAILED DESCRIPTION OF THE INVENTION

Figure 1:
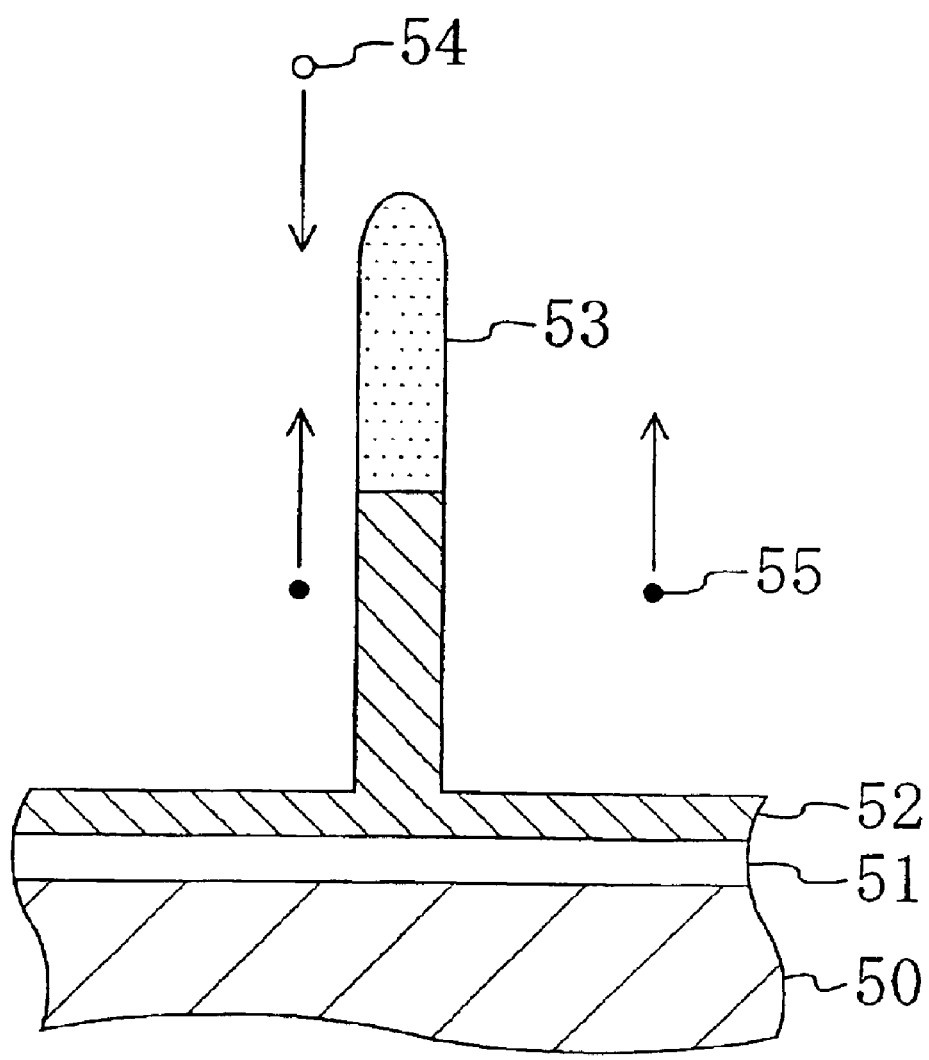
FIG. 1 is a diagram illustrating the mechanism by which copper in a Cu-containing aluminum film is dry-etched by an etching gas containing chlorine gas.
Figure 2A:
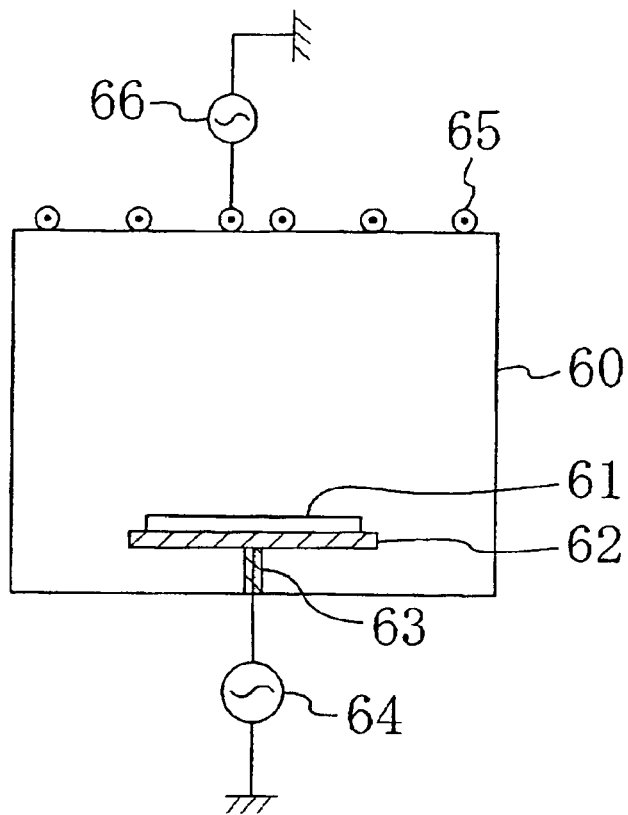
FIG. 2A is a schematic diagram of a plasma dry etching apparatus used in the dry-etching method of an embodiment according to the present invention (also used by the inventor so as to investigate the relationship between the gas stay time and the quantity of copper residues)
Figure 2B:
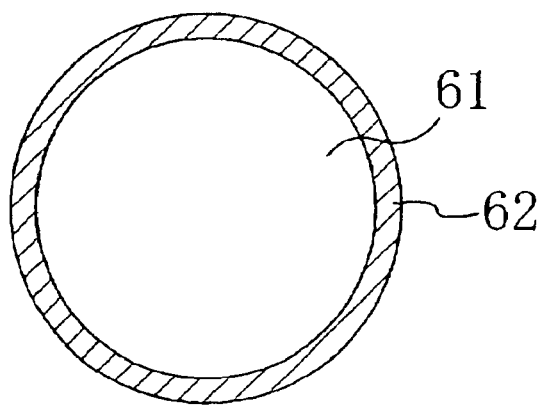
FIG. 2B is a top view of a lower electrode where a substrate that will be etched is mounted in the etching apparatus of FIG. 2A.
Figure 3:
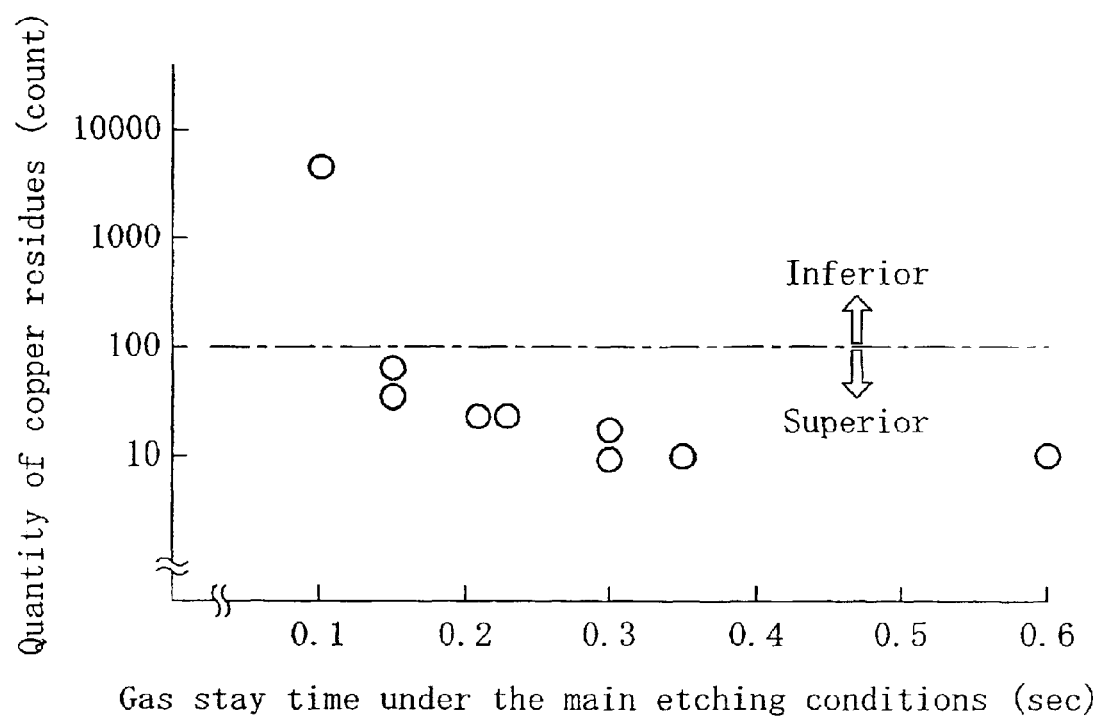
FIG. 3 is a diagram illustrating how the quantity of generated copper residues depends on the gas stay time when Cu-containing aluminum film is dry-etched.
Figure 4:
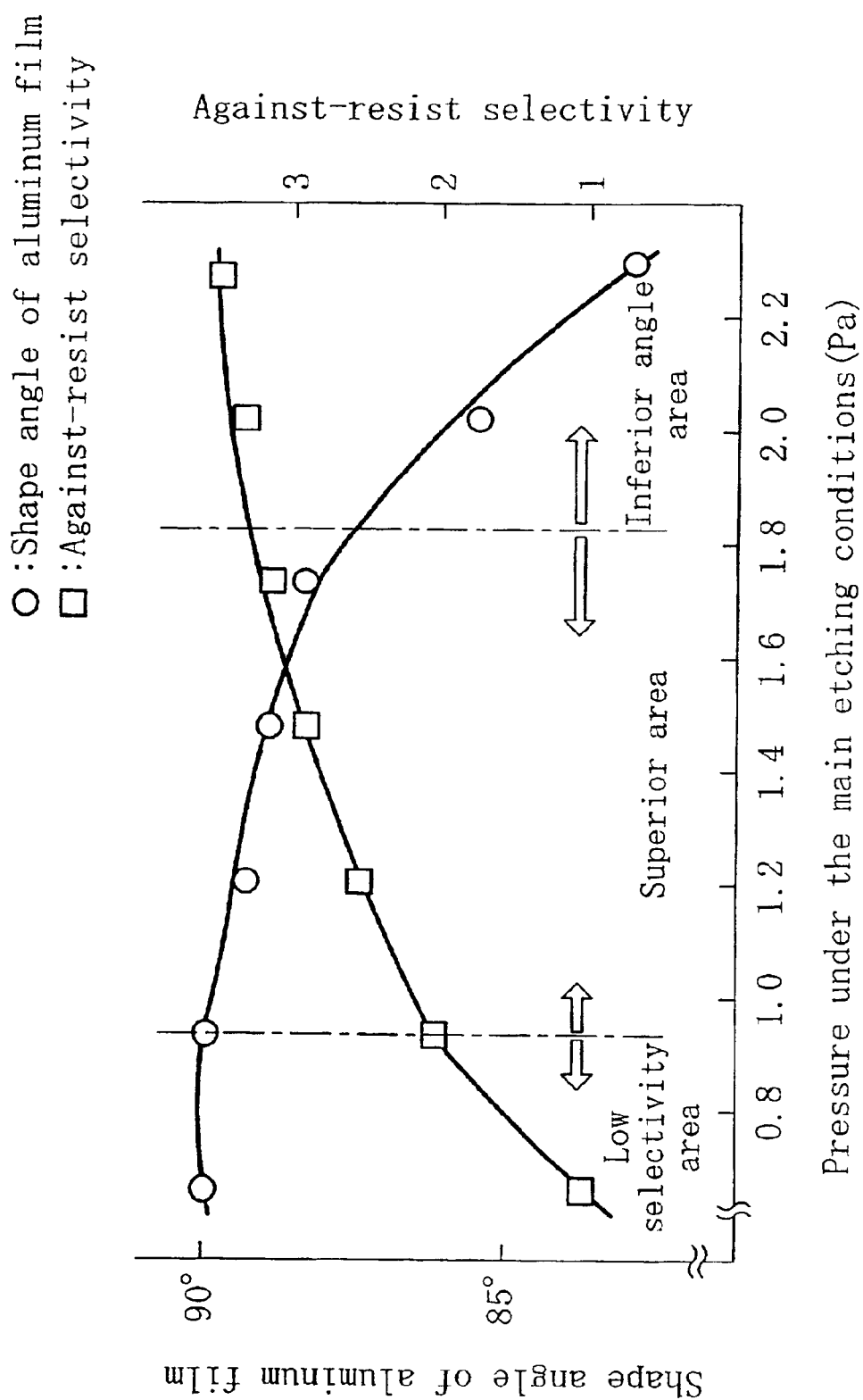
FIG. 4 is a diagram illustrating how the shape angle of the aluminum film and the against-resist selectivity respectively depend on the chamber pressure when a Cu-containing aluminum film is dry-etched.
Figure 5:
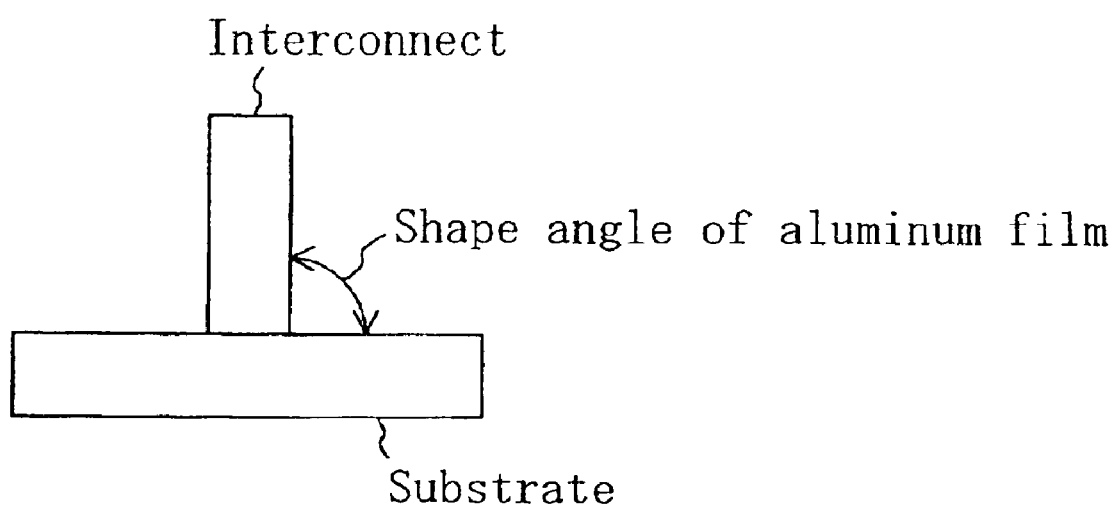
FIG. 5 is a diagram illustrating a definition of the shape angle of the aluminum film.

Now the dry-etching method according to an embodiment of the present invention, specifically, the interconnect pattern formation method employing dry-etching of the Cu-containing aluminum film is described below with reference to the attached drawings. It should be noted that the dry-etching method according to the present embodiment employs the ICP etching apparatus that is shown in FIGS. 2A and 2B.

Figure 6A:
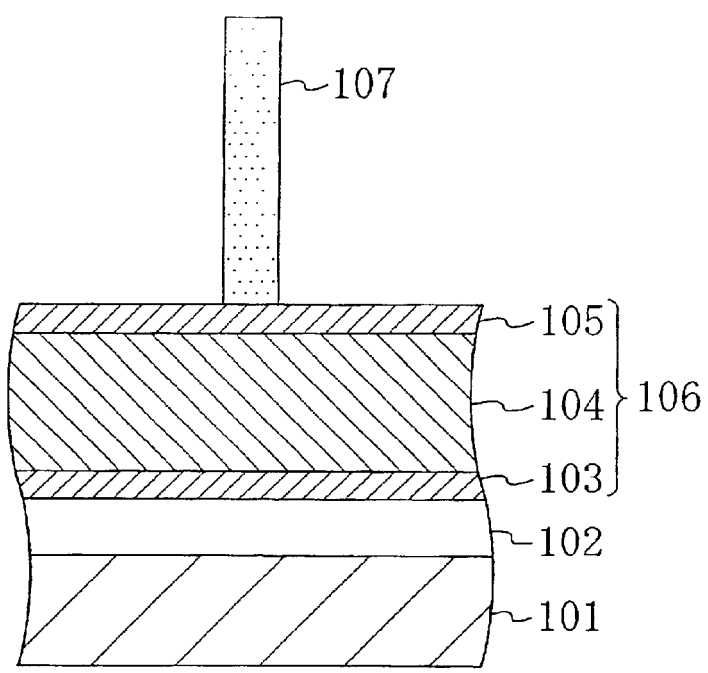
FIGS. 6A, 6B and 6C are sectional views illustrating the respective steps of the dry-etching method according to an embodiment of the present invention.
Figure 6B:
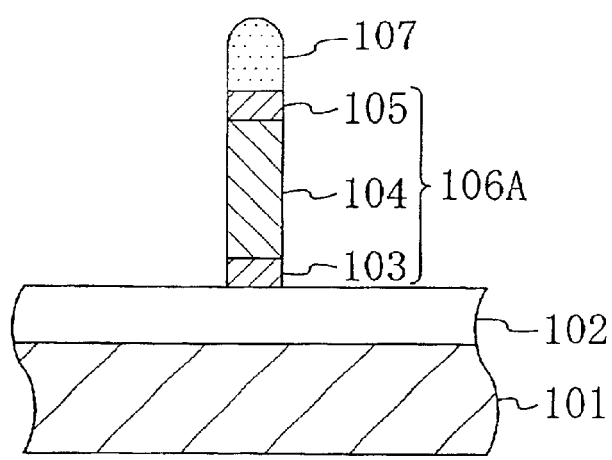
Figure 6C:
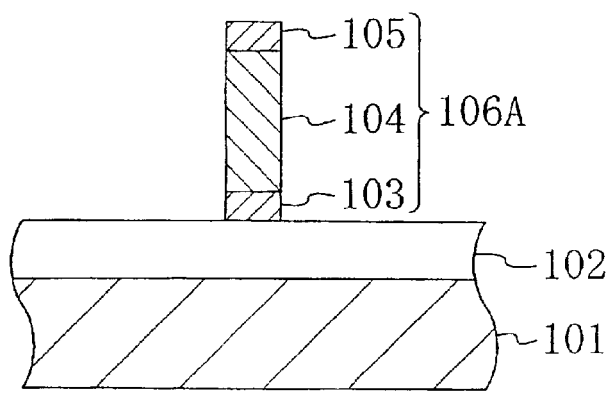
Figure 7A:
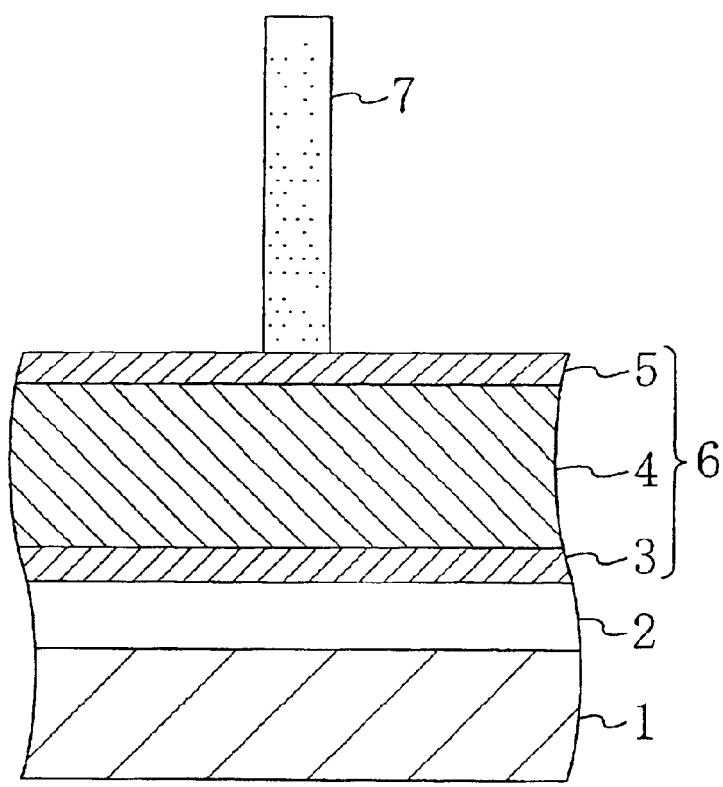
FIGS. 7A and 7B are sectional views illustrating the respective steps of the conventional dry-etching method.
Figure 7B:
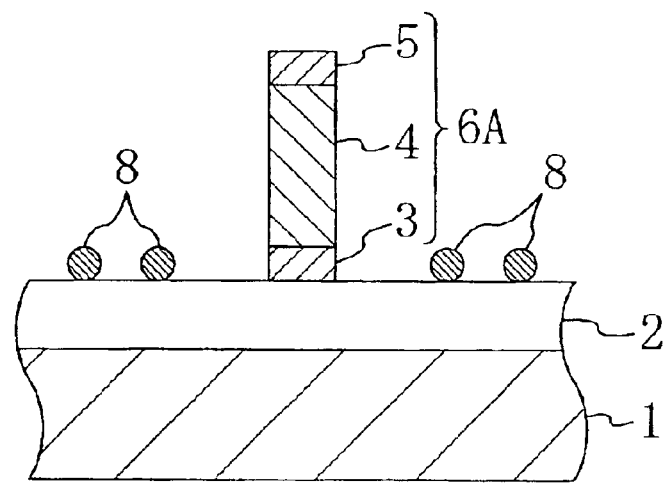
Figure 8A:
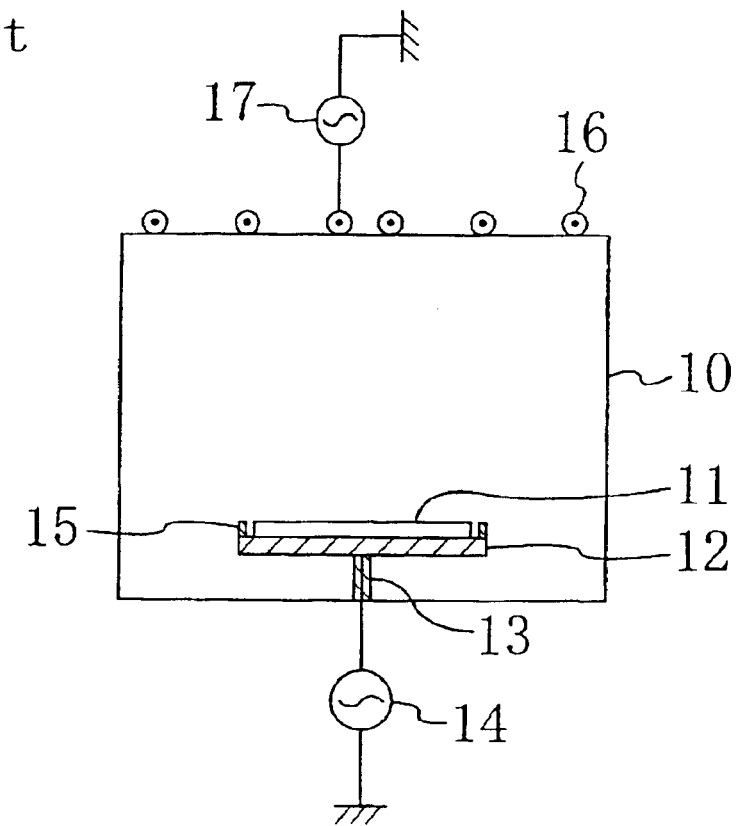
FIGS. 8A is a schematic diagram illustrating the configuration of the conventional plasma dry-etching apparatus.
Figure 8B:
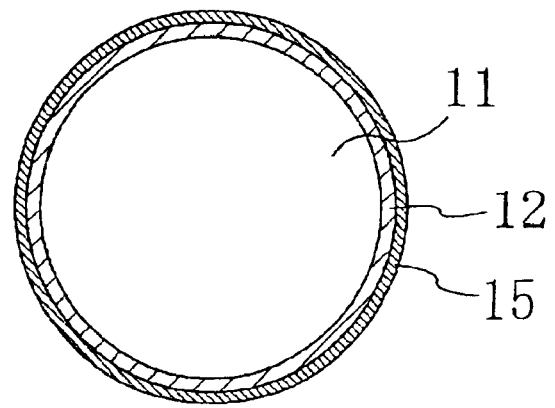
FIG. 8B is a top view of the lower electrode where the substrate that will be etched is mounted.
Figure 9:
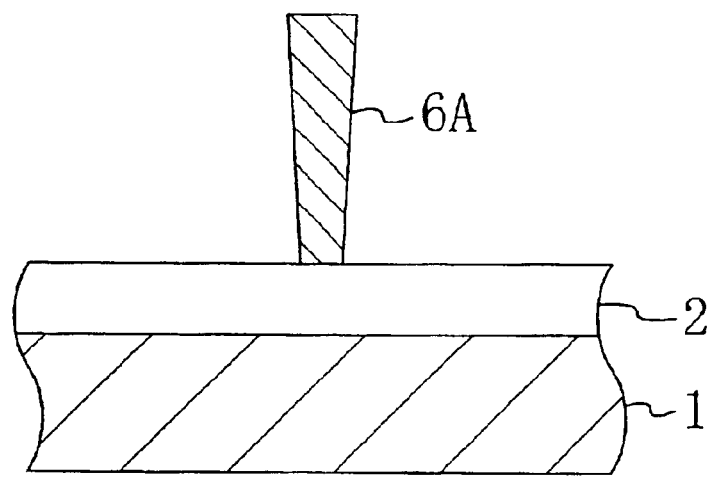
FIG. 9 is a sectional view illustrating an example of the etched interconnect formed by the conventional dry-etching method.
Figure 10:
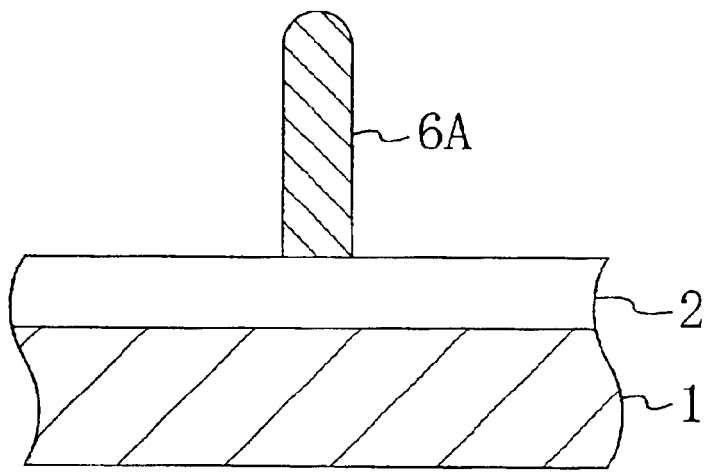
FIG. 10 is a sectional view illustrating another example of the etched interconnect formed by the conventional dry-etching method.

FIGS. 6A, 6B and 6C are sectional views illustrating the respective steps of the dry-etching method according to the present embodiment of the invention.

Referring now to FIG. 6A, a first barrier metal film 103 of a thickness of about 20 nm, a Cu-containing aluminum film 104 of a thickness of about 300 nm and a second barrier metal film 105 of a thickness of about 20 nm are formed one after another on a silicon substrate 101, for example, a 20 cm-diameter silicon wafer with a dielectric film 102 (silicon oxide film) interposed therebetween. The first barrier metal film 103 and the second barrier metal film 105 have the respective multi-layered structures composed of TiN and Ti films. The mass ratio between aluminum and copper in the Cu-containing aluminum film 104 is 99.5%:0.5%. Hereafter, the multi-layer structure made of the first barrier metal film 103, Cu-containing aluminum film 104 and the second barrier metal film 105 is referred to as a TiN/Ti/AlCu/TiN/Ti film 106. Each layer in the TiN/Ti/AlCu/TiN/Ti film 106 is deposited sequentially by sputtering, for example.

Next a resist film is formed on the TiN/Ti/AlCu/TiN/Ti film 106, and this resist film is exposed and developed for patterning. Then, as shown in FIG. 6A, a resist pattern 107 is formed that covers the interconnect region.

Subsequently, the TiN/Ti/AlCu/TiN/Ti film 106 is dry-etched, with the resist pattern 107 being used as a mask, by an etching gas containing at least chlorine gas, for example, a mixture of $BCl_3$, $Cl_2$ and $N_2$, so as to for an interconnect 106A consisting of the TiN/Ti/AlCu/TiN/Ti film 106, as shown in FIG. 6B. The volume of the chamber 60 is about 32.5 L in the ICP etching apparatus (see FIGS. 2A and 2B) used in the process shown in FIG. 6B; the high frequency power applied from the high frequency power source 66 to the inductive coupler coil 65 is 300W; the high frequency power applied from the bias power source 64 to the lower electrode 62 is 200W; and the temperature of the lower electrode 62 is 50° C. The over-etching rate is set at 30% so as to ensure the etching of the TiN/Ti/AlCu/TiN/Ti film 106.

One of the two features of the present embodiment is that the etching gas stay time (namely, gas stay time τ=chamber pressure P×chamber volume V/total etching gas flow Q) is set at anywhere between 0.15 and 0.30 seconds in the chamber 60 during the dry-etching process shown in FIG. 6B; and the other feature is that the pressure in the chamber 60 is set at anywhere between 0.93 and 1.86 Pa.

In the final step of the etching process, as shown in FIG. 6C, the residual resist pattern 107 is removed, for example, by ashing. Referring now to FIG. 6C, the interconnect 106A having a cross-section having clear-cut vertical straight sides is provided by this method. No copper residue is recognized around the interconnect 106A in this embodiment.

As described above, according to the present embodiment of the invention, the etching gas stay time in the chamber 60 is at least 0.15 seconds when the TiN/Ti/AlCu/TiN/Ti film 106 (substantially, the Cu-containing aluminum film 104) is dry-etched with a gas containing chlorine. As a result, since a sufficient amount of aluminum chloride which is a reaction product facilitating copper etching is secured, the generation of copper residue can be prevented during etching. In addition, since the gas stay time is 0.30 seconds or lower, there is no fear that the TiN/Ti/AlCu/TiN/Ti film 106 is over-etched, and the shape of the interconnect 106A formed by etching does not degrade. Since the leak current between interconnects is prevented and the interconnect resistance does not grow than desired levels, semiconductor devices of high performance can be manufactured at high yields.

According to this embodiment, since the pressure in the chamber 60 is set from 0.93 Pa to 1.86 Pa inclusive during the dry etching, the selectivity of the TiN/Ti/AlCu/TiN/Ti film 106 to the resist pattern 107 serving as an etching mask does not decrease, and the etching of the side walls of the TiN/Ti/AlCu/TiN/Ti film 106 can be prevented. The generation of copper residue is thereby prevented, and the resulting interconnect 106A has a preferable shape with high reliability.

If the silicon substrate 101 is a 20 cm-diameter wafer in this embodiment, the preferable volume of the chamber 60 is from 30 L to 35 L inclusive. In such a case, the total etching gas flow is preferably from 60 mL/min (at the standard state) to 240 mL/min (at the standard state) inclusive. If the silicon substrate 101 is a 30 cm-diameter wafer, which is the possible wafer size, the preferable volume of the chamber 60 is from 60 L to 70 L inclusive. In such a case, the total etching gas flow is preferably from 120 mL/min (at the standard state) to 480 mL/min (at the standard state) inclusive.

In the present embodiment, the mass ratio between aluminum and copper in the Cu-containing aluminum film 104 is preferably 99.0–99.9%:0.1–1.0%.

Although in the present embodiment the etching gas was a mixture gas of $BCl_3$, $Cl_2$ and $N_2$, the $N_2$ gas may be replaced by Ar, He, $CHF_3$ and $CH_4$ so as to obtain the same effect. The mixture gas does not need to contain $BCl_3$ gas.

In the present embodiment, the inductively coupled plasma (ICP) etching apparatus was employed as the etching apparatus. Instead, an electron cyclotron resonance (ECR) etching apparatus or surface wave plasma (SWP) etching apparatus may be used to obtain the same effect.

The dry-etching process for the Cu-containing aluminum film with the etching gas containing chlorine gas was controlled by the etching gas stay time in the present embodiment. However, the dry-etching process with other etching gases for other interconnect conductive films may be controlled by the gas stay time.

What is claimed is:

1. A dry etching method for dry-etching a Cu-containing aluminum film on a substrate held in a chamber by introducing etching gas containing at least chlorine in said chamber to generate plasma, wherein a gas stay time $\tau$ (=P·V/Q) is controlled between 0.15 seconds to 0.30 seconds inclusive, such that no residue of copper composing said Cu-containing aluminum film is generated, said gas is a mixture gas composed of said etching gas and an aluminum chloride, which is a reaction product of said Cu-containing aluminum film and said etching gas, P being a pressure in said chamber (unit: Pa), V being a volume of said chamber (unit: L) and Q being a total etching gas flow (unit: Pa·L/sec).

2. The dry etching method according to claim 1, wherein said substrate is a wafer having a diameter of 20 cm, and the volume of said chamber is from 30 L to 35 L inclusive.

3. The dry etching method according to claim 2, wherein the total etching gas flow is from 60 mL/min (at the standard state) to 240 mL/min (at the standard state) inclusive.

4. The dry etching method according to claim 1, wherein said substrate is a wafer having a diameter of 30 cm, and the volume of said chamber is from 60 L to 70 L inclusive.

5. The dry etching method according to claim 4, wherein the total etching gas flow is from 120 mL/min (at the standard state) to 480 mL/min (at the standard state) inclusive.

6. A dry etching method for dry-etching a Cu-containing aluminum film on a substrate held in a chamber by introducing etching gas containing at least chlorine in said chamber to generate plasma, wherein a gas stay time $\tau$ (=P·V/Q, where $0.93 \leq P \leq 1.86$)) is controlled between 0.15 seconds to 0.30 seconds inclusive, such that no residue of copper composing said Cu-containing aluminum film is generated, said gas is a mixture gas composed of said etching gas and an aluminum chloride, which is a reaction product of said Cu-containing aluminum film and said etching gas, P being a pressure in said chamber (unit: Pa), V being a volume of said chamber (unit: L) and Q being a total etching gas flow (unit: Pa·L/sec).

7. The dry etching method according to claim 6, wherein said substrate is a wafer having a diameter of 20 cm, and the volume of said chamber is from 30 L to 35 L inclusive.

8. The dry etching method according to claim 7, wherein the total etching gas flow is from 60 mL/min (at the standard state) to 240 mL/min (at the standard state) inclusive.

9. The dry etching method according to claim 6, wherein said substrate is a wafer having a diameter of 30 cm, and the volume of said chamber is from 60 L to 70 L inclusive.

10. The dry etching method according to claim 9, wherein the total etching gas flow is from 120 mL/min (at the standard state) to 480 mL/min (at the standard state) inclusive.

* * * * *